(12) United States Patent
Huh

(10) Patent No.: US 6,472,112 B2
(45) Date of Patent: Oct. 29, 2002

(54) METHOD FOR MEASURING RETICLE LEVELING IN STEPPER

(75) Inventor: Hoon Huh, Chungchongbuk-do (KR)

(73) Assignee: Hyundai Electronics Industries Co., Ltd., Kyonggi-Do (KR)

( * ) Notice: Subject to any disclaimer, the term of this patent is extended or adjusted under 35 U.S.C. 154(b) by 29 days.

(21) Appl. No.: 09/823,982

(22) Filed: Apr. 3, 2001

(65) Prior Publication Data

US 2002/0089340 A1 Jul. 11, 2002

(30) Foreign Application Priority Data

Jan. 5, 2001 (KR) .............................................. 01-628

(51) Int. Cl.⁷ ................................................ G03F 9/00
(52) U.S. Cl. ........................ 430/30; 356/399; 356/400; 356/401
(58) Field of Search ........................... 430/30; 356/399, 356/400, 401

(56) References Cited

U.S. PATENT DOCUMENTS

| | | | | |
|---|---|---|---|---|
| 4,768,883 A | | 9/1988 | Waldo et al. ................ | 356/399 |
| 6,066,419 A | * | 5/2000 | Wu et al. ...................... | 430/30 |
| 6,074,786 A | * | 6/2000 | Chiang .......................... | 430/5 |

* cited by examiner

*Primary Examiner*—Christopher G. Young
(74) *Attorney, Agent, or Firm*—Morgan, Lewis & Bockius LLP

(57) ABSTRACT

A method for measuring a reticle leveling in a semiconductor exposure device includes the steps of loading a reticle onto a stage of an exposure device, the reticle having a main cell region and a plurality of grating patterns at outer sides of the main cell region, directing a light from a light source to the plurality of grating patterns measuring electrical signals based on aerial images formed by the light passed through the grating patterns, and comparing the electrical signals and offsetting a reticle level if a substantial difference exists.

7 Claims, 4 Drawing Sheets

METHOD FOR MEASURING RETICLE LEVELING IN STEPPER

This application claims the benefit of Korean patent application No. P2001-628, filed Jan. 5, 2001 which is hereby incorporated by reference.

BACKGROUND OF THE INVENTION

1. Field of the Invention

The present invention relates to a method for fabricating a semiconductor device, and more particularly, to a method for effectively measuring reticle levelling in a semiconductor exposure device.

2. Background of the Related Art

As semiconductor device density increases, and device size formed on a semiconductor substrate decreases, interest is focused on a semiconductor exposure device which can precisely converge and project a pattern in a mask onto a wafer. A typical such device is a stepper, which is a device for forming a mask pattern on a semiconductor wafer, where accurate alignment and a pattern resolution power is important. The stepper has a wafer stage for placing a silicon wafer thereon, which is movable in X-, Y-, and Z-axes for stepping and focus adjustment. The stepper facilitates a converging projection at a scale of about 5:1 or 10:1, when a reticle disk corresponding to the scale is used. Position alignment is automated in most cases, where the position alignment is made for every chip through an optical axis, or the position alignment is made outside of the optical axis. As the reticle is used in the convergence projection, if the reticle is perfect, there are no defective devices resulting from a defective mask. However, since one defect in the reticle causes defects of the same mode in all chips, it is necessary to pay careful attention to inspection of the reticle. On the other hand, there is an advantage in that the convergence projection makes a defect smaller than a certain size in the reticle negligible in the chips themselves.

A related art exposure device and measurement of reticle leveling will be explained reference to the attached drawings. FIG. 1 schematically illustrates a related art exposure device.

Referring to FIG. 1, the related art exposure device, for example, a stepper, has a lamp 12 for emitting light, a reticle 14 under the lamp 12 having a pattern of a circuit to be formed, a convergence projection lens 16 under the reticle 14 for receiving the light from the lamp 12 to converge the pattern from the reticle 14, i.e., to transfer the pattern on the reticle 14 onto a substrate in a step and repeat fashion, and a stage 20 under the convergence projection lens 16 for loading the wafer 18 thereon. As the convergence projection lens 16 is fixed, the stage 20 moves up or down for focusing. The focusing is required for setting a distance between a top surface of the wafer 18 and the convergence projection lens 16 to a required value, since the distance varies with distortion of each wafer and a flatness of the table. The reticle 14 is fabricated by depositing a non-transparent metal film on a glass substrate, and directing an E-beam onto a portion of the film selectively, to leave the non-transparent metal film only in portions with no E-beam directed thereto. In general, the pattern on the reticle 14 is five or ten times greater than a size of the pattern intended to be formed on the wafer 18. Therefore, the stepper forms the pattern on the wafer by the following method.

The wafer 18 having a photoresist film thereon is loaded on the stage 20, and the reticle 14 with a required circuit pattern is loaded onto a reticle mount. Then, a short wavelength light is directed from the lamp 12 onto the reticle 14. Upon directing the light to the reticle 14, the pattern on the reticle 14 is transferred onto the wafer through the convergence projection lens 16, the pattern being reduced (for an example, 5/1 or 10/1). In this instance, the light is transmitted only through a portion of the reticle 14 with the non-transparent metal film is removed therefrom, to selectively expose the photoresist film on the wafer 18. The photoresist film on the selectively exposed portion is etched to form a desired pattern on the wafer 18. One of the important aspects of operation of the stepper is accurate mounting and offsetting of the reticle, particularly improvement of a depth of focus as circuit size shrinks. Moreover, leveling of the reticle in the stepper is an important aspect of development of the semiconductor technology. That is, a leveling control of the reticle stage and offsetting of a leveling error are important for semiconductor manufacturing. The verification of the leveling by focusing onto a portion of the reticle and determining and offsetting a degree of leveling according to a relative difference of a value in the related art is not particularly accurate. An actual leveling accuracy in the related art is dependent on accurate control of the focus. If there is an error in an automated focus value, the leveling value can not be reliable. Particularly, a good measurement of the leveling is not possible if a mask is loaded on the reticle stage compared to a general leveling measurement owing to a limitation of an optical focusing maintaining capability for leveling in the loading of the mask on the reticle stage.

Thus, the related art projection exposure device has the following problems.

The leveling control of the reticle stage is required at every reticle change made at every step of fabrication process, and the leveling error is required to be offset every time the error is occurred. Particularly, the leveling measurement and control by means of focus control reduces productivity, and has a low accuracy.

SUMMARY OF THE INVENTION

Accordingly, the present invention is directed to a method for measuring reticle leveling in a stepper that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for measuring a reticle leveling in a semiconductor exposure device including the steps of loading a reticle onto a stage of an exposure device, the reticle having a main cell region and a plurality of grating patterns at outer sides of the main cell region, directing a light from a light source to the plurality of grating patterns measuring electrical signals based on aerial images formed by the light passed through the grating patterns, and comparing the electrical signals and offsetting a reticle level if a substantial difference exists.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
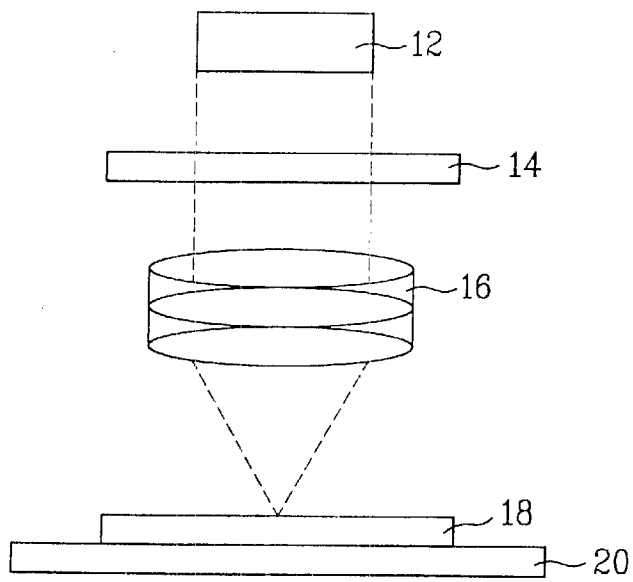
FIG. 1 schematically illustrates a related art exposure device.
Figure 2:
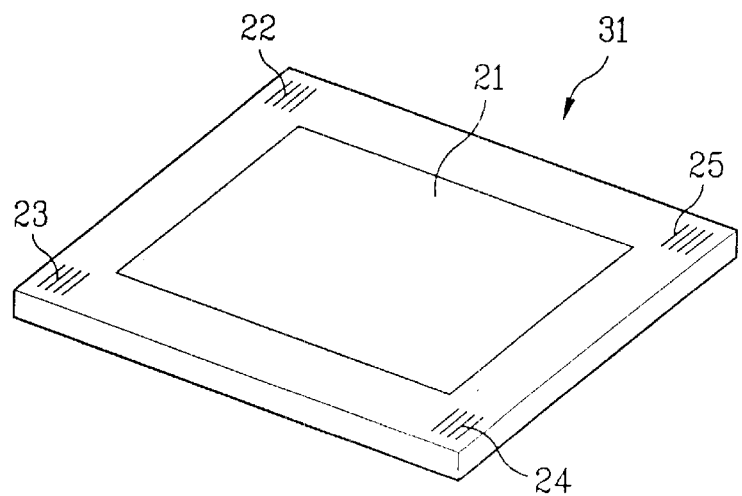
FIG. 2 illustrates positions of align marks for measuring a reticle leveling in accordance with a preferred embodiment of the present invention.
Figure 3A:
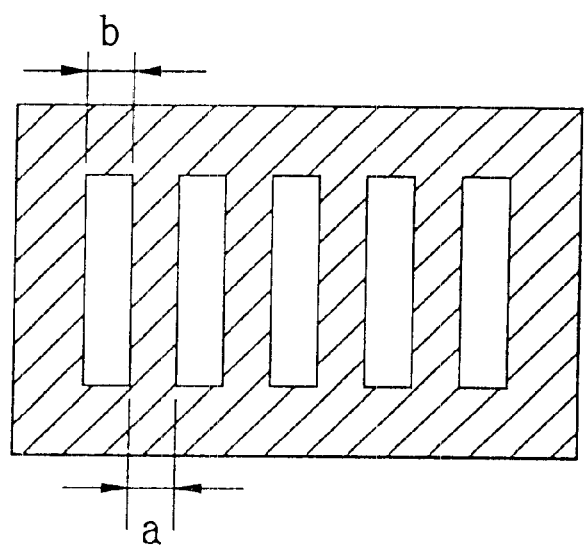
FIGS. 3A and 3B illustrate a plan view and a sectional view, respectively, of a detailed align mark of the present invention.
Figure 3B:
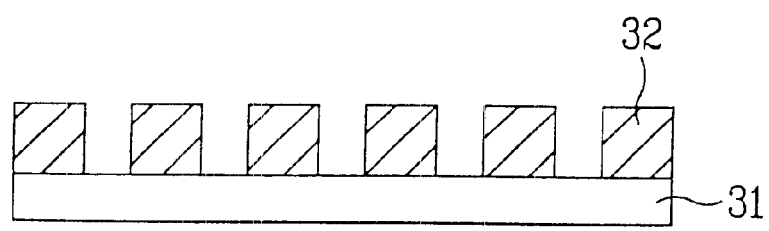
Figure 4A:
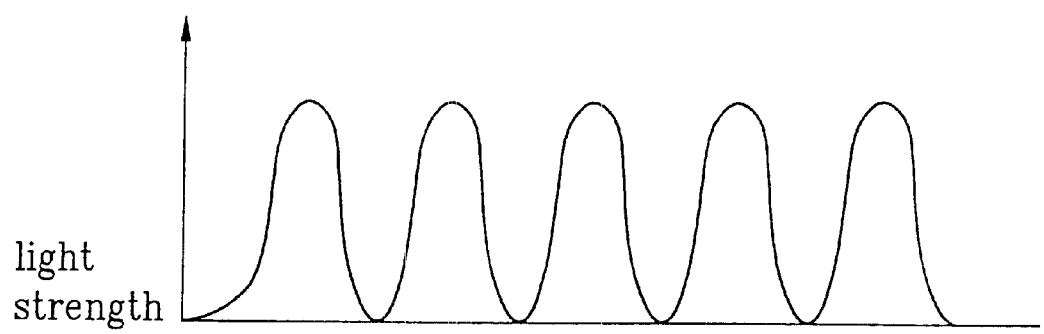
FIGS. 4A–4B illustrate profiles of a light strength and an electrical strength converted from the light strength.
Figure 4B:
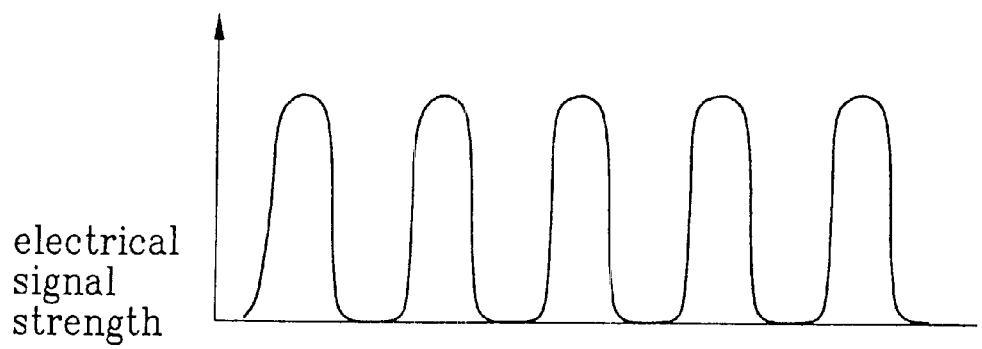
Figure 5:
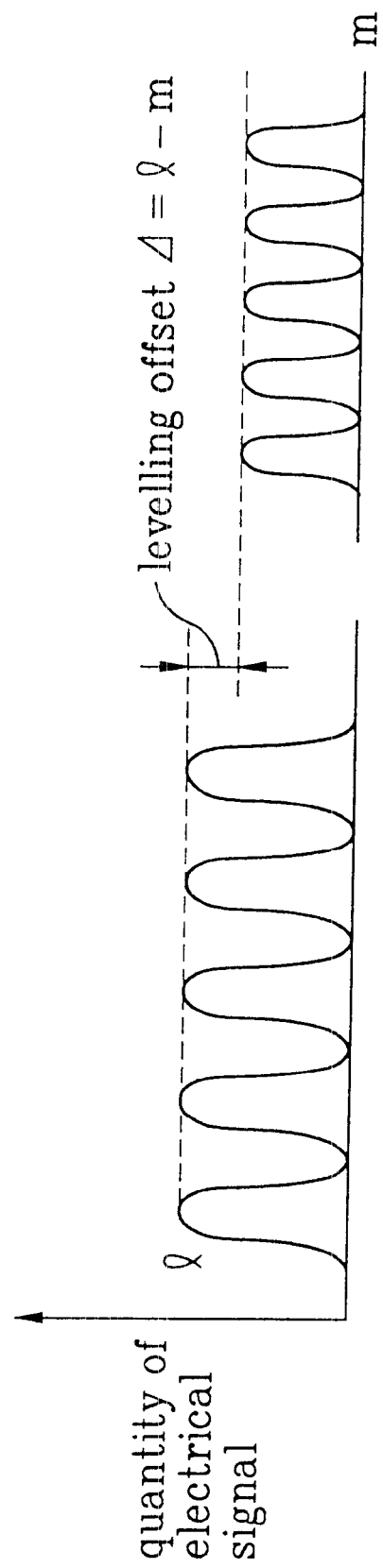
FIG. 5 illustrates one example of a reticle leveling measurement showing a difference of offsets in different local regions.

The present invention uses a specific pattern for measurement and offsetting of a leveling of a reticle mounted in an exposure device that is used during a semiconductor fabrication process. Referring to FIG. 2, a line/space grating pattern is formed on first, second, third and fourth local regions 22, 23, 24 and 25 at symmetrical positions, such as four corners, of the reticle 31 having a main cell region 21 for measuring the reticle levelling. As shown in FIGS. 3A and 3B, each layer 32 of the grating patterns has areas 'a' each with a bar of the pattern formed thereon and areas 'b' each without the bar thereon, with 'a':'b'=1:1 width ratio. That is, a pattern size with a duty ratio of 1:1 is drawn in a bar form to obtain a Cr binary mask, or a phase shift mask. The exposure device has a light source that is positioned over each of the corners, and the patterns are formed thereon. A main light source (for example, i-line, KrF, or ArF) of the exposure device is made to be directed thereto, directly. An aerial image of the grating pattern formed by a light passed through the grating pattern is created under the reticle stage, and is then converted into an electrical intensity for comparison and deriving information on the leveling by relatively comparing an incident signal to the grating pattern and an electrical signal obtained by converting the incident signal into the electrical signal. That is, a signal as shown in FIG. 4A passed through the grating pattern is obtained from each of the grating patterns in the first, second, third and fourth local regions 22, 23, 24 and 25, and converted into an electrical signal as shown in FIG. 4B by, for instance, an oscilloscope. The electrical signals obtained from the first, second, third and fourth local regions 22, 23, 24 and 25 are compared to one another as shown in FIG. 5, to derive relative differences that represent a reticle leveling. Moreover, the difference of the measured electrical intensity is used for offsetting the reticle leveling.

The method for measuring a reticle leveling in a semiconductor exposure device has the following advantages.

A leveling accuracy of a reticle mounted in an exposure device for use in semiconductor exposuring technology that requires high resolution can be met. The conversion of a light intensity into an electrical intensity in verifying a leveling between local sites provides an excellent control capability.

It will be apparent to those skilled in the art that various modifications and variations can be made in the method for measuring a reticle leveling in a semiconductor exposure device of the present invention without departing from the spirit or scope of the invention. Thus, it is intended that the present invention cover the modifications and variations of this invention provided they come within the scope of the appended claims and their equivalents.

What is claimed is:

1. A method for measuring a reticle leveling in a semiconductor exposure device comprising the steps of:

loading a reticle onto a stage of an exposure device, the reticle having a main cell region and a plurality of grating patterns at outer sides of the main cell region;

directing a light from a light source to the plurality of grating patterns;

measuring electrical signals based on aerial images formed by the light passed through the grating patterns; and comparing the electrical signals and offsetting a reticle level if a substantial difference exists.

2. The method as claimed in claim 1, further comprising the step of repeating the steps of directing, measuring and comparing.

3. The method as claimed in claim 1, wherein the plurality of grating patterns are formed at symmetric positions.

4. The method as claimed in claim 1, wherein each of the plurality of grating patterns includes a layer having a first area with a bar of the grating pattern formed thereon, and a second area without the bar formed thereon, a ratio of a width of the first area to a width of the second area being 1:1.

5. The method as claimed in claim 1, wherein the light source is any one of i-line, KrF, and ArF.

6. The method as claimed in claim 1, wherein the comparing step uses an oscilloscope.

7. The method as claimed in claim 1, wherein the grating pattern includes at least one of a Cr binary mask and a phase shift mask.

* * * * *